(12) United States Patent
Suh et al.

(10) Patent No.: US 7,402,909 B2
(45) Date of Patent: Jul. 22, 2008

(54) MICROELECTRONIC PACKAGE INTERCONNECT AND METHOD OF FABRICATION THEREOF

(75) Inventors: Daewoong Suh, Phoenix, AZ (US); Amram Eitan, Scottsdale, AZ (US); Yongki Min, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 365 days.

(21) Appl. No.: 11/116,537

(22) Filed: Apr. 28, 2005

(65) Prior Publication Data

US 2006/0243958 A1    Nov. 2, 2006

(51) Int. Cl.
*H01L 23/48* (2006.01)
*H01L 23/52* (2006.01)

(52) U.S. Cl. ............ 257/753; 977/932
(58) Field of Classification Search .......... 977/732, 977/742; 257/753, 758
See application file for complete search history.

(56) References Cited

U.S. PATENT DOCUMENTS

| | | | | |
|---|---|---|---|---|
| 6,383,923 | B1* | 5/2002 | Brown et al. | 438/666 |
| 7,094,679 | B1* | 8/2006 | Li et al. | 438/618 |
| 2003/0089899 | A1* | 5/2003 | Lieber et al. | 257/9 |
| 2004/0246650 | A1* | 12/2004 | Grigorov et al. | 361/212 |
| 2005/0142933 | A1* | 6/2005 | Beer et al. | 439/540.1 |
| 2005/0191842 | A1* | 9/2005 | Aggarwal et al. | 438/622 |
| 2005/0196950 | A1* | 9/2005 | Steinhogl et al. | 438/622 |
| 2005/0201034 | A1* | 9/2005 | Hasegawa | 361/100 |

OTHER PUBLICATIONS

Huang, Z P., et al., "Growth of highly oriented carbon nanotubes by plasma-enhanced hot flament chemical vapor deposition", *Applied Physics Letters*, vol. 73, No. 26, (Dec. 28, 1998),3845-3847.
Koratkar, Nikhil A., et al., "Multifunctional structural reinforcement featuring carbon nanotube films", *Composites Science and Technology*, (2003), 7 pages.
Vohs, Jason K., et al., "Low-Temperature Growth of Carbon Nanotubes from the Catalytic Decmposition of Carbon Tetrachloride", *J. Am. Chem. Soc.*, 126, (2004),9936-9937.

* cited by examiner

*Primary Examiner*—W. David Coleman
(74) *Attorney, Agent, or Firm*—Kenneth A. Nelson

(57) ABSTRACT

A method of interconnecting and an interconnect is provided to connect a first component and a second component of an integrated circuit. The interconnect includes a plurality of Carbon Nanotubes (CNTs), which provide a conducting path between the first component and the second component. The interconnect further includes a passivation layer to fill the gaps between adjacent CNTs. A method of producing Anisotropic Conductive Film (ACF) and an ACF is provided. The ACF includes a plurality of CNTs, which provide a conducting path between a first side of the ACF and a second side of the ACF. The sides of the ACF can also include a conductive curable adhesive layer. In an embodiment, the conductive curable adhesive layer can incorporate a B-stage cross-linkable polymer and silver particles.

15 Claims, 5 Drawing Sheets

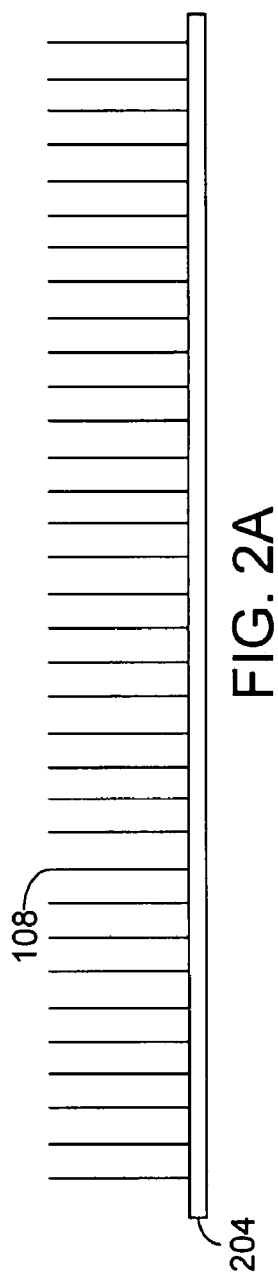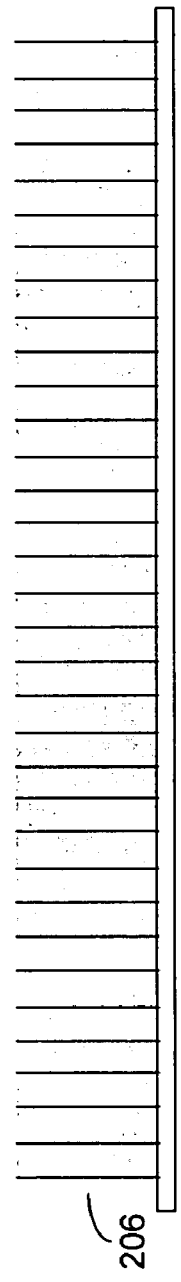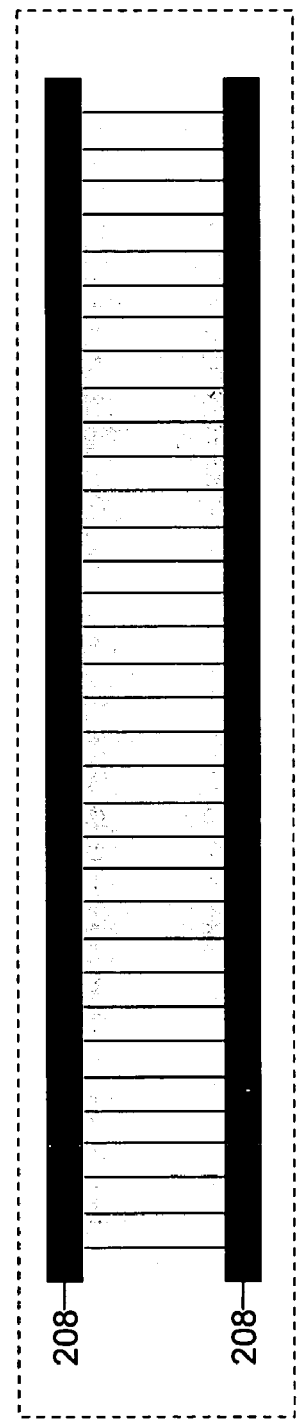

MICROELECTRONIC PACKAGE INTERCONNECT AND METHOD OF FABRICATION THEREOF

BACKGROUND

The embodiments of the present invention relate to the field of integrated circuit devices, and more particularly to the field of fabrication of an interconnect and to the field of producing Anisotropic Conductive Film (ACF).

In an integrated circuit device, one component is attached to another component using an interconnect. The interconnect provides a conductive path to connect the two components of the integrated circuit device. Examples of the components include a Silicon (Si) die, a substrate, and a board.

Conventional interconnect technologies involves the use of metallic bumps or a conductive film to provide the conductive path. In the case of metallic bumps, as the size of the components decreases, the bump size needs to be decreased. The reduced bump size results in a higher current density. This results in increased resistance and electromigration. Further, in the case of conductive films, the conductive path is not continuous and, hence, the current-carrying capability is less.

BRIEF DESCRIPTION OF THE DRAWINGS

The various embodiments of the present invention will hereinafter be described in conjunction with the appended drawings provided to illustrate and not to limit the present invention, wherein like designations denote like elements, and in which:

FIGS. 2A, 2B and 2C are schematic representations of different stages for fabrication of an interconnect, in accordance with an embodiment of the present invention;

DETAILED DESCRIPTION OF PREFERRED EMBODIMENTS

Various embodiments of the present invention provide an interconnect and method for fabricating the same. The interconnect can provide a conductive path to connect one component to another component in an integrated circuit device. The conductive path includes a plurality of Carbon Nanotubes (CNTs).

The high current-carrying capability of CNTs, as CNTs can behave as ballistic conductors, results in higher conductivity of the interconnect. Aligned arrays of CNTs exhibit reduced electromigration compared to conventional metals, at current densities which are substantially higher than the current densities experienced by the conventional interconnects. Further, since the diameter of the CNTs is typically less than 100 nm, the CNT-based interconnect can be used for fine pitch applications.

Figure 1:
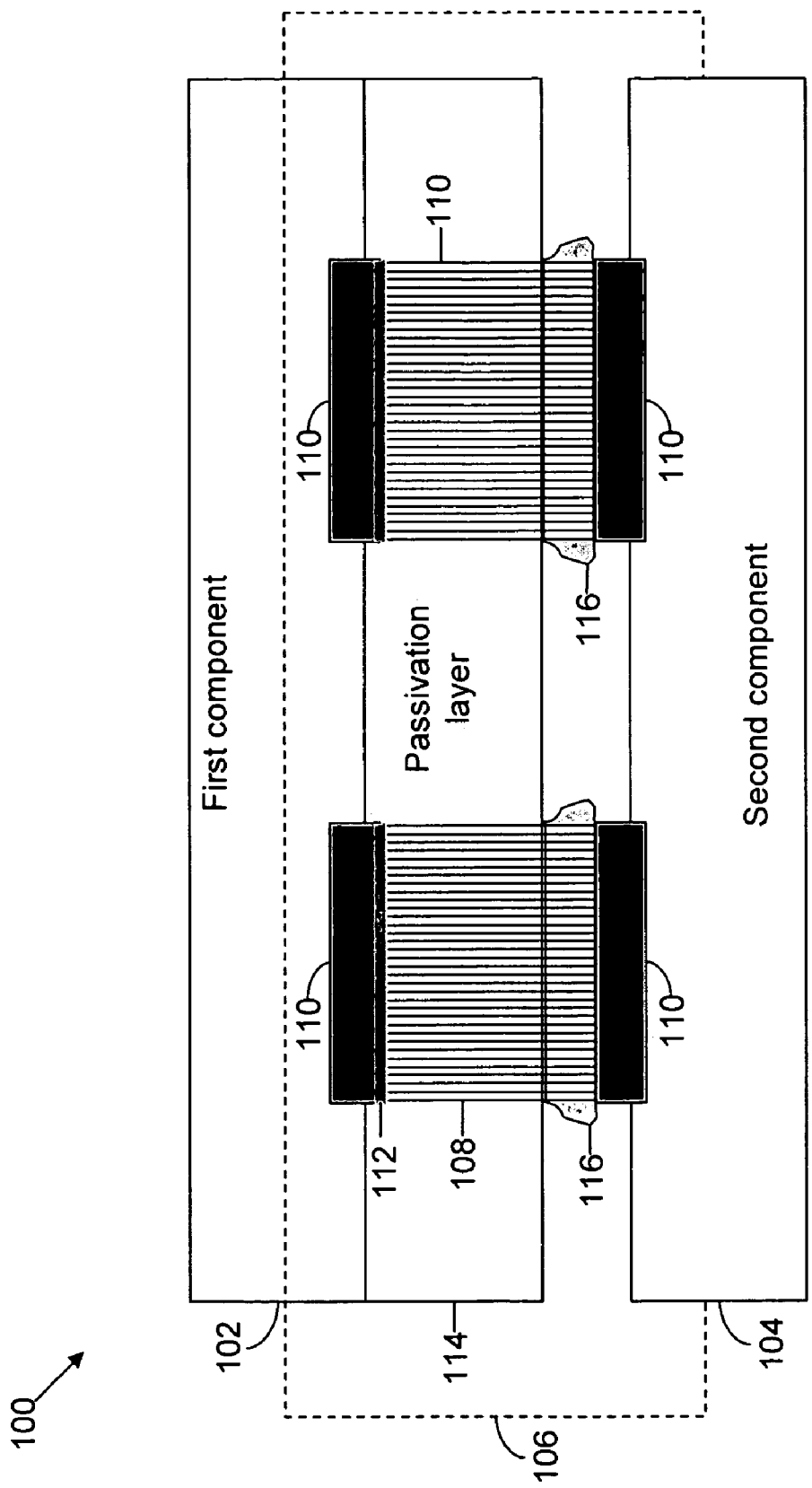
FIG. 1 is a schematic representation of an apparatus suitable for use in an integrated circuit, in accordance with an embodiment of the present invention.

FIG. 1 is a schematic representation of an apparatus 100 suitable for use in an integrated circuit, in accordance with an embodiment of the present invention. Apparatus 100 includes a first component 102, a second component 104 and an interconnect 106. Examples of the components include a die, a substrate, and a board. Examples of a die include silicon (Si), gallium arsenide (GaAs), and Indium Phosphate (InP). Interconnect 106 includes a plurality of CNTs 108 to provide a conductive path between first component 102 and second component 104.

In an embodiment of the present invention, CNT 108 is a cylindrical shaped fullerene molecule having diameter of 1-10 nm and length up to 100 nm. CNTs 108 are used in the interconnect because of their superior current-carrying capability and high thermal conductivity. CNTs 108 can carry a current density of about $10^9$ A/cm$^2$ without physical damage. Further, CNTs 108 can have a thermal conductivity of up to 3000 W/mK.

Interconnect 106 can further include a plurality of metallic pads 110, a plurality of metal catalyst layers 112, a passivation layer 114, and a solder material 116. Metallic pads 110 are attached to the surfaces of first component 102 and second component 104. Metallic pads 110 are conductive and can sustain a temperature up to about 600° C. According to various embodiments of the present invention, metallic pads 110 are made up of copper.

Further, metal catalyst layers 112 can be deposited on metallic pads 110 attached to first component 102. Metal catalyst layers 112 provide a surface to grow CNTs 108 using, for example, Chemical Vapor Deposition (CVD) and Physical Vapor Deposition (PVD). CVD is a technique used to transform a gaseous precursor into a solid material on a solid surface. In the case of PVD, techniques such as sputtering and evaporation can be used to deposit various metal elements on a solid surface.

Examples of material used for metal catalyst layers 112 include copper, iron, cobalt, molybdenum, ruthenium, nickel, and their compounds. In an embodiment of the present invention, metallic pads 110 are not used and hence, metal catalyst layers 112 are deposited on the surface of first component 102.

CNTs 108 have a high electrical and thermal conductivity along their tube axis. In an embodiment of the present invention, CNTs 108 are aligned substantially perpendicular to the surfaces of first component 102 and second component 104. According to various embodiments of the present invention, multi-walled CNTs 108 are used as conductive path. According to various embodiments of the present invention, Plasma Enhanced Chemical Vapor Deposition (PECVD) is used to grow CNTs 108. In an embodiment of the present invention, PECVD is used to grow highly aligned multi-walled CNTs 108 on a substrate such as a Cu pad.

The PECVD uses an inductively coupled plasma process to grow CNTs 108 at a lower temperature as compared to CVD. In a PECVD process, acetylene ($C_2H_2$) is used to provide carbon for the growth of CNTs 108 and ammonia ($NH_3$) gas for dilution gas and catalysis. A tungsten filament coil powered by a direct-current source and a plasma generator are used to generate heat and plasma for the growth of CNTs 108.

Further, referring to FIG. 1, CNTs 108 are coated with passivation layer 114. Passivation layer 114 fills the gaps between CNTs 108 to provide electrical insulation, thermal conducting path, and mechanical support to CNTs 108. Examples of materials that can be used for the Passivation layer 114 include inorganic materials such as Silicon dioxide ($SiO_2$) and polymer materials such as polyimide. In another embodiment of the present invention, a polymer layer could be used between the CNTs. At times, passivation layer 114 gets overcoated and hence, the overcoat needs to be removed. The overcoat may be removed using Chemical Mechanical Polishing (CMP). CMP is a process that uses an abrasive material to remove the overcoat. During the CMP process, some portion of CNTs 108 can get exposed above the passivation layer. This is because CNTs 108 have higher strength and better wear-resistance as compared to passivation layer 114. The length of the exposed portion may be controlled by CMP process variables. The length of the exposed portion may be optimized for specific applications. However, typically, the length of the exposed portion may range from 0.025 µm to 1 µm. The lateral regions of exposed portion of CNTs 108 can be coated with metals such as tin to provide a wettable surface to the lateral regions of exposed portion of CNTs 108. The ends of the exposed portions of CNTs 108 can be coated with carbide-forming metals such as titanium, zirconium, tantalum, etc to minimize contact resistance between the ends of CNTs 108 and solder material 116. The metal coating provides a wettable surface to the ends of CNTs 108. The wettable surface is subsequently used to connect CNTs 108 with second component 104 using a solder joint.

Solder material 116 is deposited on metallic pads 110 attached to second component 104. Solder material 116 undergoes solder reflow process to form a metallurgical solder joint between CNTs 108 and second component 104. Solder material 116 is deposited using techniques such as electroplating, stencil printing, and Physical Vapor Deposition (PVD). According to an embodiment of the present invention, solder material 116 is deposited on the metal coating provided on the ends and lateral regions of the exposed portion of CNTs 108.

According to an embodiment of the present invention, the solder joint is such that CNTs 108 are substantially in contact with metallic pads 110 attached with second component 104. Since, ends of CNTs 108 touch metallic pads 110 attached with second component 104, there is negligible, if any, electromigration due to high current density. According to another embodiment of the present invention, the ends of CNTs 108 do not touch metallic pads 110 and there is a gap between the ends of CNTs 108 and metallic pads 110. In an embodiment of the present invention, the gap between the ends of CNTs 108 and metallic pads 110 attached to second component 104 is such that negligible, if any, electromigration takes place in the solder joint, where this gap varies with the current density. According to an embodiment of the present invention, when pure Sn is used for the calculations, the gap may range from 0.1 µm to 1.0 µm for current density of $10^5$ A/cm$^2$ to $10^4$ A/cm$^2$, respectively, such that negligible, if any, electromigration occurs in the solder material 116.

FIGS. 2A, 2B, and 2C represents schematic representations of different stages for fabricating an interconnect 202, in accordance with another embodiment of the present invention. Such an interconnect can be referred to as Anisotropic Conductive Film (ACF). In the first stage of fabrication, shown in FIG. 2A, a plurality of CNTs 108 are grown on substrate 204. According to various embodiments of the present invention, SiO$_2$ is used as a material for substrate 204. The method for growing CNTs 108 on substrate 204 can be the same as the method for growing CNTs 108 on metallic pads 110 attached with first component 102. In an embodiment of the present invention, the CNTs 108 grown on substrates 204 result in a unidirectionally aligned multi-walled CNT structure.

In the second stage, shown in FIG. 2B, the array of CNTs 108 is impregnated with a polymer layer 206, such that polymer layer 206 fills the gaps between CNTs 108. Examples of polymer layer 206 include polymerizable monomer, solvent based polymer, low molecular weight polymer (cross-linked at a later stage), methyl methacrylate, ethyl methacrylate, and styrene.

According to various embodiments of the present invention, the impregnation includes spin coating of polymer layer 206 on the array of CNTs 108. This allows an even dispersion of CNTs 108 within polymer layer 206 and prevents CNTs 108 from aggregating together to form bundles.

The impregnation can further include the initiators to polymerize polymer layer 206. The polymerization can take place in an oven on a temperature controlled plate. According to various embodiments of the present invention, an inert atmosphere, such as argon and nitrogen, is used for the polymerization.

Further, in the case of polymer layer 206 being a solvent based polymer, curing involves evaporating the solvent. In the case of low molecular weight polymer, curing may involve cross-linking the low molecular weight polymer.

In the third stage of fabrication, shown in FIG. 2C, CNTs 108 along with polymer layer 206 are detached from substrate 204. Thereafter, a conductive curable adhesive layer 208 is attached to both ends of CNTs 108. According to various embodiments of the present invention, the conductive curable adhesive layer is a conductive curable polymer tape. Conductive curable adhesive layer 208 is provided to attach interconnect 202 with, for example, a silicon die and a board. In an embodiment of the present invention, conductive curable adhesive layer 208 is a B-stage cross-linkable polymer and contains conductive silver particles. Conductive curable adhesive layer 208 can further include non-adherent liners attached to it. In an embodiment of the present invention, interconnect 202 incorporates CNTs 108 along with polymer layer 206 and conductive curable adhesive layer 208 attached to both ends of CNTs 108.

Figure 3B:
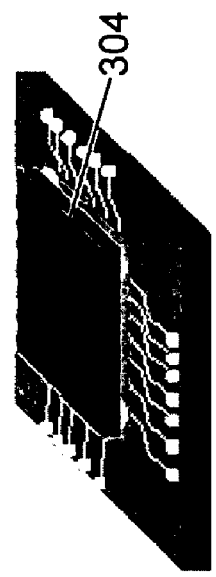
FIGS. 3A, 3B, 3C and 3D represent a block diagram for a process for attaching an interconnect with a component A and a component B, in accordance with an embodiment of the present invention.
Figure 3C:
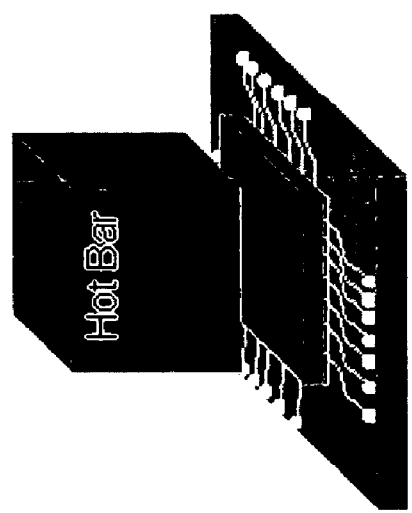
Figure 3A:
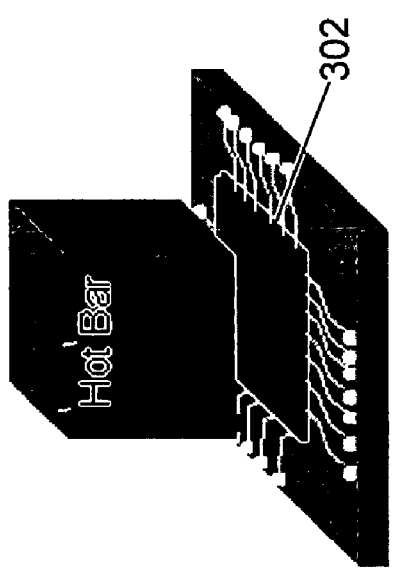
Figure 3D:

FIGS. 3A, 3B, 3C and 3D represent a block diagram for a process for attaching interconnect 202 with a component A 302 and a component B 304. In FIG. 3A interconnect 202 is placed and prebonded on component A 302 using a hot bar. In an embodiment of the present invention, the prebonding is done for a few seconds at a temperature of around 90° C. According to various embodiments of the present invention, the prebonding is done for two to four seconds. FIG. 3B shows that non-adherent liner is released from interconnect 202. Further, FIG. 3C shows that component B 304 is placed on top of interconnect 202. Thereafter, FIG. 3D shows that interconnect 202 is cured to effect attachment to component A 302 and component B 304. In an embodiment of the present invention, the curing of the interconnect 202 is accomplished in a few second by applying a pressure of about 10 MPa to 120 MPa per unit area of metal contact at a temperature of about 150° C. to 210° C.

Figure 4:
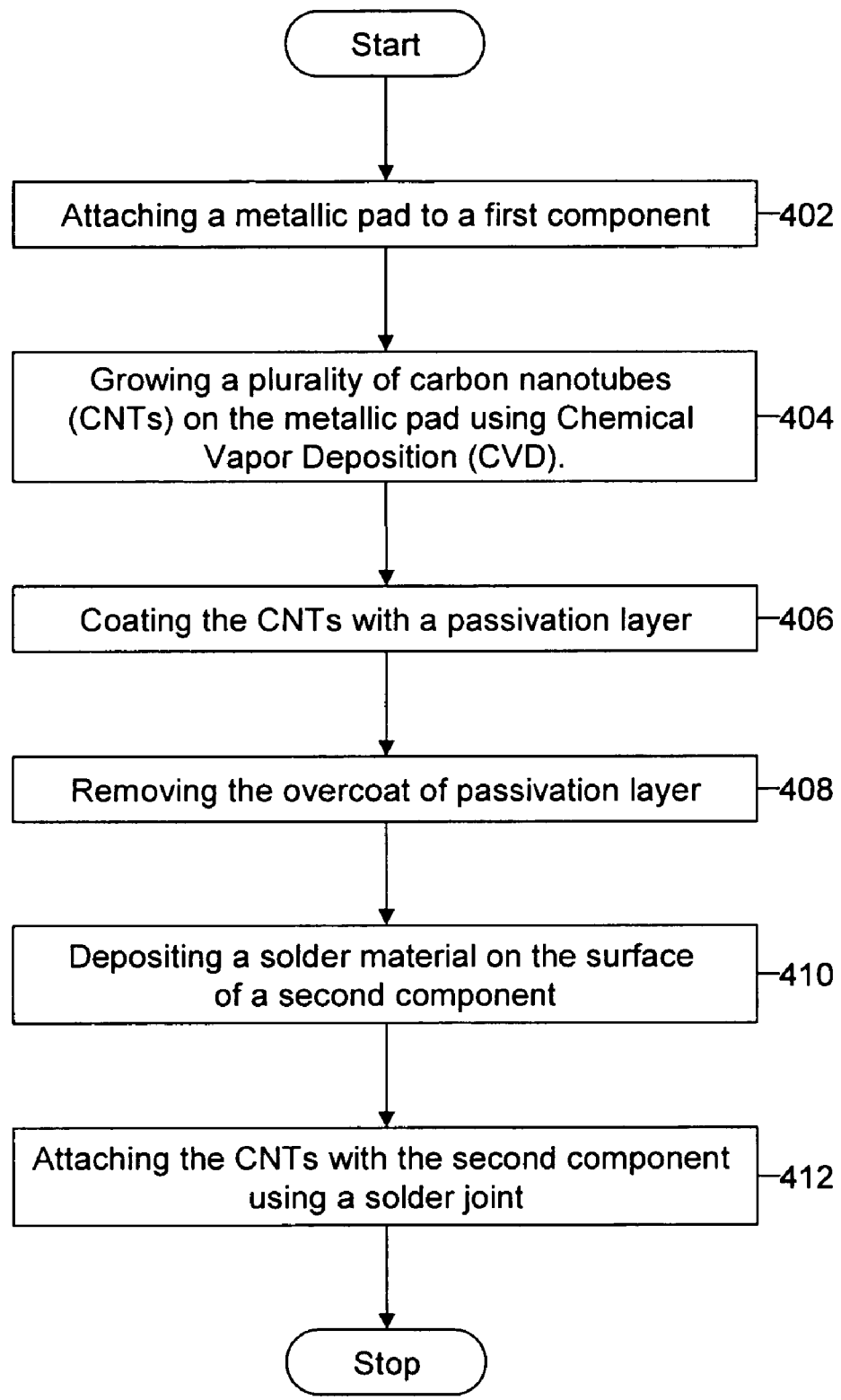
FIG. 4 is a flowchart of a method for providing an interconnect, in accordance with an embodiment of the present invention.

FIG. 4 is a flowchart of a method for providing an interconnect 106, in accordance with an embodiment of the present invention. At 402, metallic pad 110 is attached to first component 102, for example, a Si die. Thereafter, at 404, multiple CNTs 108 are grown on metallic pad 110. In an embodiment of the present invention, PECVD may be used to grow CNTs 108 by using an inductively coupled plasma process or direct-current plasma-assisted hot filament CVD at temperatures of about 500° C. to 800° C.

Further, at 406, CNTs 108 are coated with passivation layer 114, such as SiO$_2$ or polyimide. Passivation layer 114 is provided to fill the gaps between CNTs 108. This provides mechanical support for CNTs 108 and electrical and thermal insulation. At 408, the overcoat of passivation layer 114 is removed. This overcoat can be removed using chemical mechanical polishing (CMP). During the CMP process, a portion of the ends of CNTs 108 gets exposed above passivation layer 114. This is because CNTs 108 have higher strength and wear resistance as compared to passivation layer 114. The length of the exposed portion may be controlled by CMP process variables. The ends and lateral regions of the exposed portions of CNTs 108 can then be coated with a metal, such as titanium or tin, where the metal coating provides the wettable surface and minimum contact resistance of the exposed portion of CNTs 108.

Thereafter, at 410, solder material 116 can be deposited on the surface of second component 104. According to an embodiment of the present invention, solder material 116 is deposited on the metal coating provided on the ends of the exposed portions of CNTs 108. Further, at 412, CNTs 108 are attached to second component 104 using a solder joint.

Figure 5:
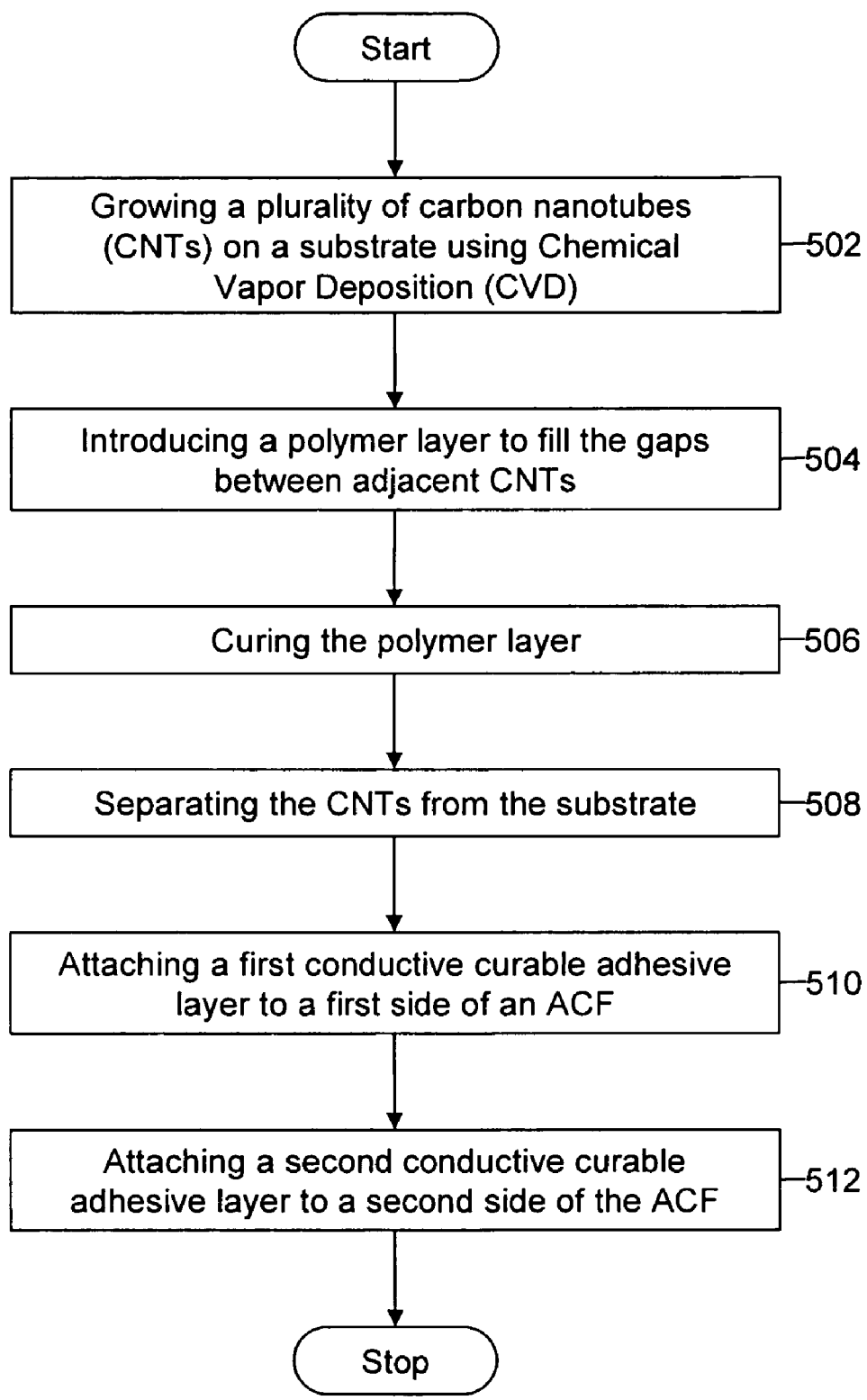
FIG. 5 is a flowchart of a method for producing an Anisotropic Conductive Film (ACF), in accordance with another embodiment of the present invention.

FIG. 5 is a flowchart of a method for producing an ACF, in accordance with another embodiment of the present invention. At 502, a plurality of CNTs 108 are grown on the surface of substrate 204 using PECVD. According to an embodiment of the present invention, CNTs 108 are grown such that the distance between two successive CNTs 108 is a few nanometers. Further, according to various embodiments of the present invention, CNTs 108 are grown perpendicular to the surface of substrate 204. Thereafter, at 504, a polymer layer 206 is impregnated between CNTs 108. Examples of polymer layer 206 include polymerizable monomer, solvent based polymer, low molecular weight polymer, methyl methacrylate, ethyl methacrylate, and styrene. Polymer layer 206 fills the gaps between CNTs 108 via capillary forces. The impregnation can further include the initiators to cure polymer layer 206. Thereafter at 506, the polymer layer 206 is cured. In an embodiment of the present invention, curing involves polymerization of polymer layer 206. The polymerization takes place in an oven on a temperature controlled plate. According to various embodiments of the present invention, an inert atmosphere, such as argon and nitrogen, is used for the polymerization.

Further, in the case of polymer layer 206 being a solvent based polymer, curing involves evaporating the solvent.

Further, at 508, CNTs 108 along with polymer layer 206 are detached from substrate 204. Thereafter, at 510, a first conductive curable adhesive layer is attached to first side of the ACF. Further at 512, a second conductive curable adhesive layer is attached to second side of the ACF. According to various embodiments of the present invention, the first and second conductive curable adhesive layers are conductive curable polymer tape. Non-adherent liners can be attached on the outer surfaces of the first and second conductive curable adhesive layers. CNTs 108 along with polymer layer 206 and conductive curable adhesive layer 208 attached to both ends of CNTs 108 can be referred to as an ACF, or interconnect, and can be used to form an interconnect between two components. The conductive curable adhesive layer 208 can be a B-stage cross-linked polymer where the B-stage adhesive is fully cured in the step of attaching the ACF as an interconnect 202. According to various embodiments of the present invention, CNTs 108 run from a first side of ACF to a second side of ACF.

The embodiments of the present invention offer various advantages. The highly aligned CNTs are provided as a conducting path in an interconnect. The high current-carrying capability and high thermal conductivity of CNTs results in higher electrical and thermal conductivity of the interconnect. CNTs do not exhibit electromigration at current densities which are substantially higher than the current densities experienced by the conventional interconnects. Further, since the distance between two adjacent CNTs can be scaled down to nanometer scale. The subject interconnect can be used for fine pitch applications, such as less than or equal to 30 microns.

While the various embodiments of the present invention have been illustrated and described, it will be clear that the present invention is not limited to these embodiments only. Numerous modifications, changes, variations, substitutions and equivalents will be apparent to those skilled in the art without departing from the spirit and scope of the present invention as described in the claims.

What is claimed is:

1. An interconnect, comprising:
   a plurality of Carbon Nanotubes (CNTs) to provide a conductive path between a first component and a second component; and
   a passivation layer positioned to fill the gaps between adjacent CNTs, wherein the CNTs are attached to the first component using a first conductive curable adhesive layer and the CNT's are attached to the second component using a second conductive curable adhesive layer.

2. The interconnect according to claim 1, wherein the CNTs are multi-walled CNTs.

3. The interconnect according to claim 1, wherein the CNTs are aligned perpendicular to a first contact surface of the first component and a second contact surface of the second component.

4. The interconnect according to claim 1, wherein the CNTs are grown on a metallic pad attached to the first component.

5. The interconnect according to claim 1, wherein the first and second conductive curable adhesive layers comprise silver particles.

6. The interconnect according to claim 1, wherein the passivation layer comprises a material selected from the group consisting of: Silicon dioxide ($SiO_2$) and a polymer layer.

7. The interconnect according to claim 4, wherein the CNTs are attached to the second component using a solder joint.

8. The interconnect according to claim 7, wherein the CNTs are in contact with the second component.

9. The interconnect according to claim 7, wherein the CNTs are not in contact with the second component, wherein the distance between the CNTs and the second component is such that approximately no electromigration occurs with respect to the current passing through the solder joint.

10. The interconnect according to claim 6, wherein the polymer layer comprises a material selected from the group consisting of: methyl methacrylate, ethyl methacrylate, and styrene.

11. An Anisotropic Conductive Film (ACF) comprising:
    a plurality of Carbon Nanotubes (CNTs) to provide a conductive path between a first side of the ACF and a second side of the ACF, wherein the CNTs run from the first side of the ACF to the second side of the ACE; and
    a polymer layer positioned to fill the gaps between adjacent CNTs.

12. The ACF according to claim 11, wherein the CNTs are multi-walled CNTs.

13. The ACE according to claim 12, further comprising:
    a first conductive curable adhesive layer attached to the first side of the ACE; and a second conductive curable adhesive layer attached to the second side of the ACE.

14. The ACF according to claim 13, further comprising:
    a first non-adherent liner attached to the first conductive curable adhesive layer; and
    a second non-adherent liner attached to the second conductive curable adhesive layer.

15. The ACE according to claim 13, wherein the first conductive curable adhesive layer comprises a B-stage cross-linkable polymer.

* * * * *